(12) United States Patent
Ramanathan et al.

(10) Patent No.: US 8,076,662 B2
(45) Date of Patent: Dec. 13, 2011

(54) ELECTRIC FIELD INDUCED PHASE TRANSITIONS AND DYNAMIC TUNING OF THE PROPERTIES OF OXIDE STRUCTURES

(75) Inventors: Shriram Ramanathan, Acton, MA (US); Changhun Ko, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 12/626,865

(22) Filed: Nov. 27, 2009

(65) Prior Publication Data

US 2011/0175047 A1 Jul. 21, 2011

Related U.S. Application Data

(60) Provisional application No. 61/118,107, filed on Nov. 26, 2008.

(51) Int. Cl.
*H01L 29/02* (2006.01)
*H01L 47/00* (2006.01)

(52) U.S. Cl. ........... 257/2; 257/4; 257/43; 257/E49.002; 438/104

(58) Field of Classification Search ................. 257/2, 43, 257/4, E49.002; 438/104
See application file for complete search history.

(56) References Cited

U.S. PATENT DOCUMENTS

| | | | | |
|---|---|---|---|---|
| 2004/0069991 A1* | 4/2004 | Dunn et al. | ...................... | 257/75 |
| 2005/0098836 A1* | 5/2005 | Kim et al. | ...................... | 257/379 |
| 2008/0237578 A1* | 10/2008 | Levy | ............................... | 257/24 |

* cited by examiner

*Primary Examiner* — Tu-Tu Ho
(74) *Attorney, Agent, or Firm* — Rauschenbach Patent Law Group; Elizabeth Eunjoo Kim

(57) ABSTRACT

Phase transitions (such as metal-insulator transitions) are induced in oxide structures (such as vanadium oxide thin films) by applying an electric field. The electric field-induced phase transitions are achieved in $VO_2$ structures that scale down to nanometer range. In some embodiments, the optical and/or dielectric properties of the oxide structures are actively tuned by controllably varying the applied electric field. Applying a voltage to a single-phase oxide material spontaneously leads to the formation of insulating and conducting regions within the active oxide material. The dimensions and distributions of such regions can be dynamically tuned by varying the applied electric field and/or the temperature. In this way, oxide materials with dynamically tunable optical and/or dielectric properties are created.

12 Claims, 9 Drawing Sheets

ELECTRIC FIELD INDUCED PHASE TRANSITIONS AND DYNAMIC TUNING OF THE PROPERTIES OF OXIDE STRUCTURES

CROSS-REFERENCE TO RELATED APPLICATIONS

The present application is based upon, and claims the benefit of priority under 35 U.S.C. §119, to co-pending U.S. Provisional Patent Application No. 61/118,107 (the "'107 provisional application"), filed Nov. 26, 2008 and entitled "Electric Field-Assisted Phase Transition in Thin Film Vanadium Oxide." The content of the '107 provisional application is incorporated herein by reference in its entirety as though fully set forth.

STATEMENT REGARDING FEDERALLY SPONSORED RESEARCH

This invention was made with government support under FA9550-08-1-0203 awarded by the U.S. Air Force Office of Scientific Research. The government has certain rights in the invention.

BACKGROUND

Vanadium oxide ($VO_2$) undergoes a metal-insulator transition (MIT), in the vicinity of about 67° C., that is accompanied by a dramatic conductivity change of several orders of magnitude. Electric-field triggered conductance changes in oxide materials such as $VO_2$ are of interest because of the potential of fabricating new classes of electronic devices such as switches for computing technologies. Of particular interest is the fabrication of metal-oxide-semiconductor (MOS) devices that incorporate a functional oxide whose properties can be controlled by means of external stimuli.

More generally, the study of the MIT functionality of oxide structures (such as $VO_2$ thin films) that can be modulated by external stimuli, such as an electric field or the temperature, may be useful in a wide range of applications that include without limitation bolometers, microscale electro-optic modulators, infrared detectors, and innovative memory elements.

BRIEF DESCRIPTION OF THE DRAWINGS

The drawings disclose illustrative embodiments. They do not set forth all embodiments. Other embodiments may be used in addition or instead.

DESCRIPTION

In the present disclosure, methods and systems are disclosed that relate to electric field-induced phase transitions (such as metal-insulator transitions) in oxide structures. In particular, the use of vanadium oxide ($VO_2$) thin films (a model strongly correlated oxide material) as switching elements whose conductance can be tuned by an electric field is disclosed. Also disclosed are electric field-induced phase transitions that are achieved in $VO_2$ structures that scale down to nanometer range. In some embodiments of the present disclosure, the optical and/or dielectric properties of the oxide structures are actively tuned by controllably varying the applied electric field. In this way, oxide materials with dynamically tunable optical and/or dielectric properties are created.

In the present disclosure, the term "layer" and the term "thin film" have the same meaning, and are used interchangeably. The term "oxide layer" means a layer of oxide material. The term "oxide thin film" means a thin film of oxide material. The term "oxide layer" and the term "oxide thin film" have the same meaning, and are used interchangeably.

In the present disclosure, the term "functional material" refers to a material that undergoes a change in electrical resistance or conductance when one or more external stimuli are applied to the material. The term "functional layer" refers to a layer made of functional material. The terms "functional material" and "smart material" have the same meaning and are used interchangeably.

Illustrative embodiments are now discussed. Other embodiments may be used in addition or instead.

Figure 1:
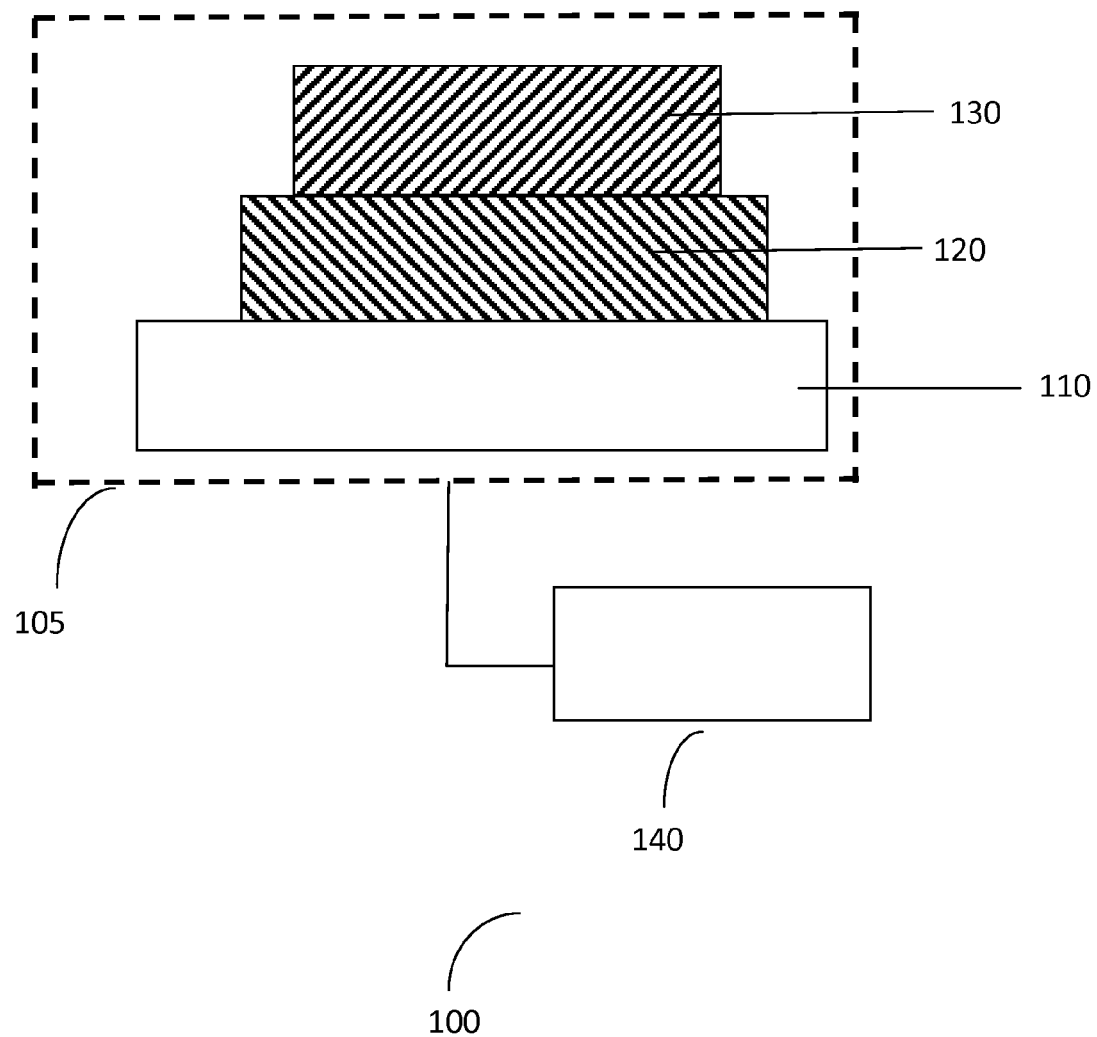
FIG. 1 is a schematic diagram of a system including a metal-oxide-semiconductor capacitor device that can undergo an electric-field induced phase transition.

FIG. 1 is a schematic diagram of a system 100 that includes metal-oxide-semiconductor capacitor device 105 that can undergo an electric field-induced phase transition. In overview, the system 100 includes a substrate 110; a $VO_2$ (vanadium oxide) thin film 120 deposited on the substrate; and an electrode 130 fabricated on the $VO_2$ thin film. The capacitor structure 105 is also referred to as a metal-oxide-semiconductor (MOS) device. The system 100 further includes a controller 140 (for example, a microprocessor) configured to controllably apply an electric field to the $VO_2$ thin film 120 through the electrode 130, so as to vary the conductance of the $VO_2$ thin film 120 until a metal-insulator transition is induced across the thin film 120.

In some embodiments, the substrate 110 is a semiconductor substrate made of a semiconductor material, including but not limited to Si, Ge, and InAs. In one or more embodiments, the substrate 100 is an As-doped silicon substrate having a resistivity of about 0.002-0.005 Ωcm. In some embodiments, the substrate 110 is heavily doped, and acts as a conducting layer.

The $VO_2$ thin film 120 can be synthesized on the substrate 110 using a number of techniques, including without limitation physical vapor deposition, chemical vapor deposition, and oxidation. The thickness of the film 120 may range between a few nanometers to several hundred nanometers.

In some embodiments, the $VO_2$ thin film 120 may be grown on heavily As-doped silicon substrates by RF sputtering from a $VO_2$ target, and may have a thickness of about 50-200 nm (nanometers). Further details of this synthesis procedure are given for example in C. Ko and S. Ramanathan, Journal of Applied Physics, 103, 106104 (2008)(the "Ko & Ramanathan reference"). $VO_2$ undergoes a phase transition in the vicinity of about 67° C., leading to a metal-insulator transition (MIT) that is accompanied by conductivity change of several orders of magnitude. Details of this phase transition are also given in the Ko & Ramanathan reference. The Ko & Ramanathan reference is herein incorporated by reference in its entirety for all that it teaches without exclusion of any part thereof.

In some embodiments, the electrode 130 may be made of a metal, including without limitation Pt, Pd, Cu, and Au, and may be grown on top of the substrate to provide an electrical current flow path. Alternatively, the electrode 130 may be made of a metal alloy, or a highly doped semiconductor. In some embodiments, the electrode 130 may be a Pd (palladium) layer grown on the $VO_2$ thin film 120 by e-beam evaporation with a shadow mask. The Pd layer may have a thickness of about 200 nm.

Applying an electric field across the $VO_2$ thin film 120 changes the conductance of the film, since its electric resistance can be manipulated by electric fields, or other external parameters such as temperature or a magnetic field. A $VO_2$ thin film is a model of a strongly correlated oxide structure. In some embodiments of the present disclosure, the $VO_2$ thin film is used as a switching element whose conductance can be tuned by an electric field. In these embodiments, the capacitor structure 105 is a phase transition switch. In these embodiments, a MOS device that incorporates $VO_2$ is used as a phase transition switch whose conductance can be controlled through an electric field.

In some embodiments, the capacitor structure 105 can be used for charging applications. In other embodiments, the capacitor structure 105 can be used as a control in a larger circuit to critically control the current flowing through the circuit.

In the illustrated embodiment, the capacitor structure 105 has a current—perpendicular-plane geometry. As further described below, an electric field-induced phase transition can be observed in the system 100. The transition is demonstrated over a range of temperatures starting from as low as room temperature.

Figure 2:
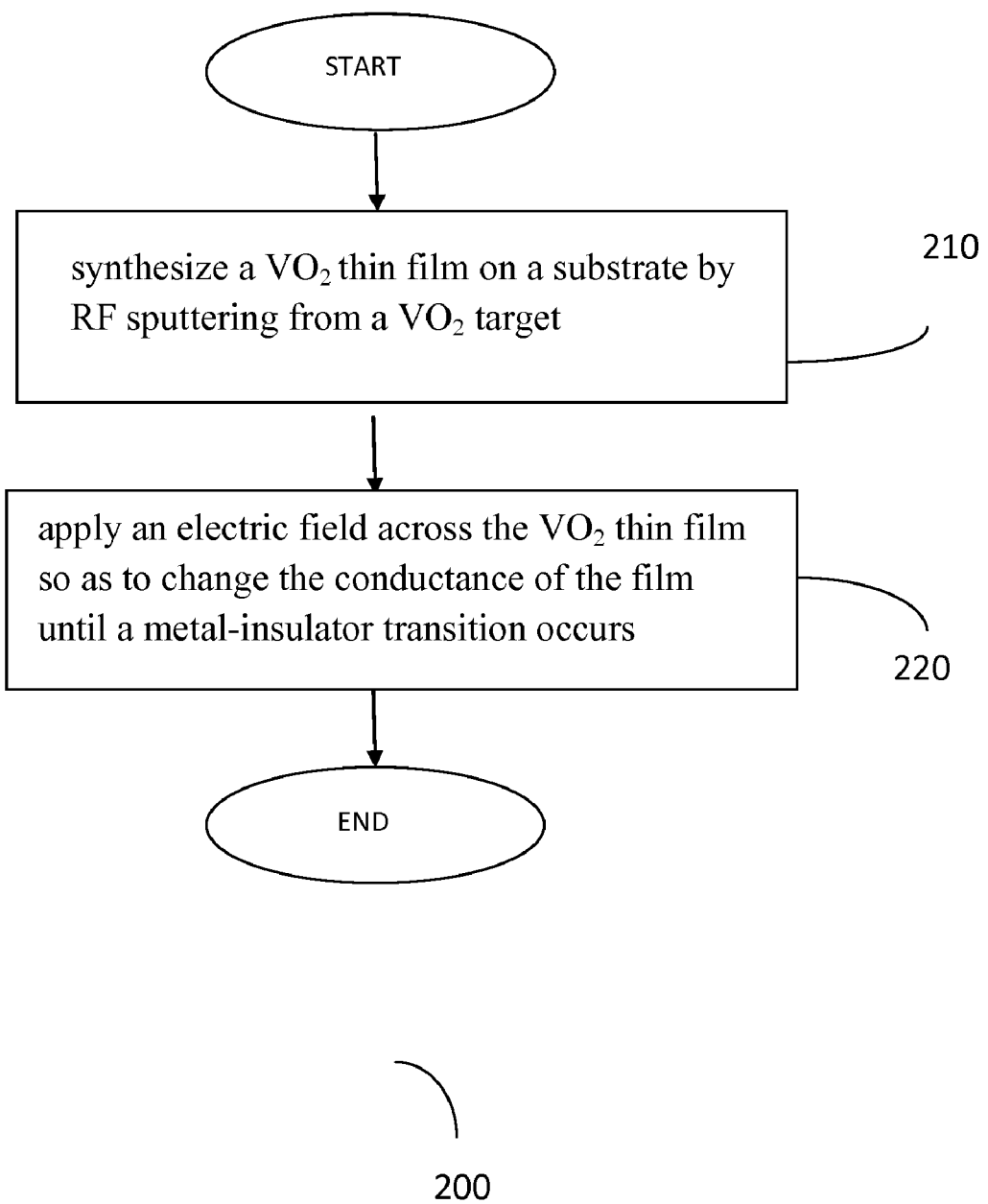
FIG. 2 illustrates a schematic flow chart of a method of generating an electric field-induced metal-insulator transition (MIT) in a thin film $VO_2$ structure.

FIG. 2 illustrates a schematic flow chart of a method 200 of electrically inducing a metal-insulator transition in a thin film $VO_2$ structure. The method 200 includes an act 210 of synthesizing the $VO_2$ thin film on a substrate by RF sputtering from a $VO_2$ target, and an act 220 of applying an electric field across the synthesized $VO_2$ thin film at a temperature T, thereby varying the conductance of the $VO_2$ thin film until the metal-insulator transition occurs.

In some embodiments, the applied electric field is controllably varied in order to control the conductance of the $VO_2$ thin film, and thereby actively tune the conductance (and other dielectric and/or optical properties) as desired. In these embodiments, the controller 140 (shown in FIG. 1) is configured to controllably apply an electric field to the vanadium oxide thin film through the electrode, so as to control the conductance of the thin film until a metal-insulator transition is induced across the thin film.

In some embodiments, the critical electric field, i.e. the threshold electric field strength for initiating the metal-insulator transition, is controlled by varying the temperature T. In one or more embodiments, T is about room temperature, and threshold electric field strength for initiating the metal-insulator transition is about $10^7$ V (volts)/m (meter). In these embodiments, the controller 140 (shown in FIG. 1) is further configured to apply the electric field to the vanadium oxide thin film at a temperature T, and to control the threshold electric field strength for initiating the metal-insulator transition by varying the temperature T.

In some embodiments, the substrate is a doped semiconductor substrate. In these embodiments, the threshold electric field strength for initiating the metal-insulator transition may be controlled by changing the doping of the substrate. In other embodiments, the threshold electric field strength for initiating the metal-insulator transition may be controlled by varying the strain of the $VO_2$ thin film. In this way, the electrical properties of the oxide films and the resulting devices are tuned using several control parameters.

In some embodiments, the $VO_2$ thin film is incorporated as a channel Coupled with metal electrodes or conducting electrodes, a three-terminal switch such as a transistor can be fabricated.

Using the method described in conjunction with FIG. 2, MIT may be achieved in the capacitor structure 105 by applying an electric field at as low as room temperature and without any hysteresis.

Figure 3:
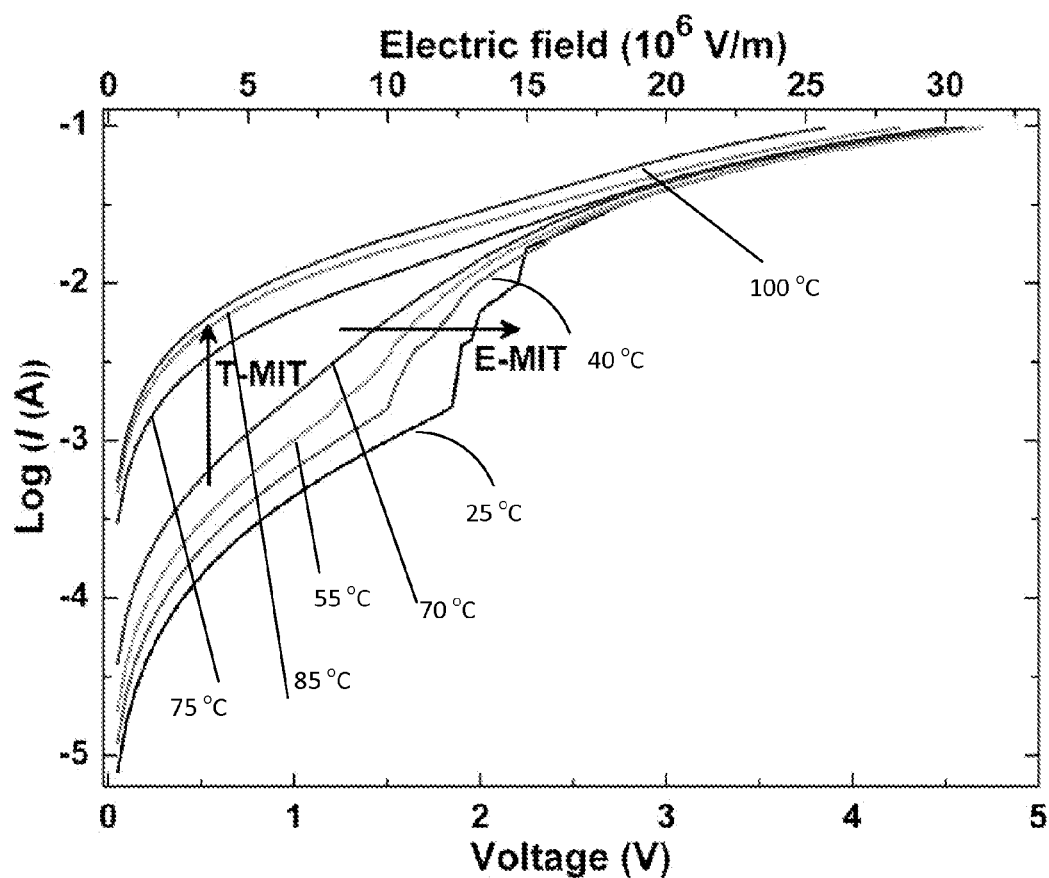
FIG. 3 shows experimental current versus voltage (or electric field) data in an electric-field assisted phase transition across a vanadium oxide thin film.

FIG. 3 illustrates experimental current versus voltage (or electric field) data in an electric-field assisted phase transition across a vanadium oxide thin film deposited on a silicon substrate. In particular, FIG. 3 shows a set of representative log/versus V (or electric field E) curves measured in the vertical mode with increasing T. An abrupt change in leakage current is seen both with increasing T and E, in FIG. 3. These two conductivity jumps, triggered differently, likely result from thermally induced MIT and electric field-assisted MIT, respectively.

In the illustrated embodiment, the onset E for transition is about $10^7$ V/m at near RT (room temperature) during both heating and cooling cycles and decreases as a function of T with activation energy of about 0.2 eV. The I-V curves present the Ohmic relationship when $T<T_{MIT}$ in high field regime ($E>\sim2.3\times10^7$ V/m). This implies that the $VO_2$ film experiences the transition from the IP (insulating phase) to the MP (metal phase) due to the field.

The properties of materials at the nanoscale in general differ qualitatively from the properties of bulk materials. In some embodiments of the present disclosure, electric-field assisted phase transitions are induced in nanoscale oxide devices. In particular, an electric field assisted MIT effect in $VO_2$ is disclosed that scales down to nanometer range device junctions.

Figure 4:
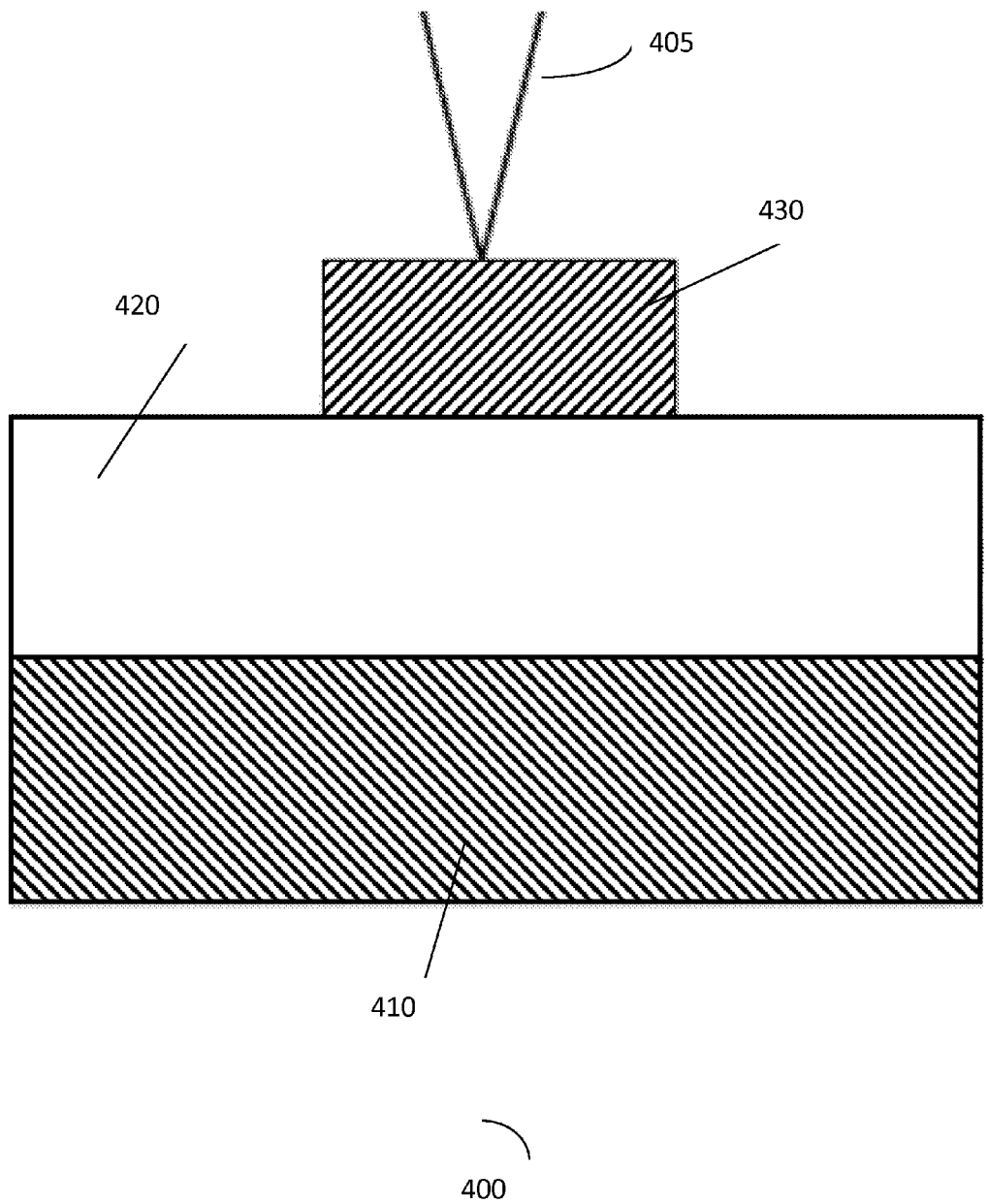
FIG. 4 is a schematic diagram of a nanoscale oxide structure that includes a nanodot fabricated on top of a thin film oxide sample.

FIG. 4 is a schematic diagram of a nanoscale oxide structure 400 that includes a nanodot fabricated on top of a thin film oxide sample. In overview, the nanoscale structure 400 includes a substrate 410; a nanoscale oxide thin film 420 deposited on the substrate 410; and one or more nanodots 430 deposited on the nanoscale oxide thin film 420. While a single nanodot 430 is illustrated in FIG. 4 for clarity, it should be understood that an array of nanodots 430 are typically deposited on the oxide thin film 420.

When an electric field is applied to nanodot 430, the nanodot is adapted to transmit the electric field across the nanoscale oxide thin film so that the conductance of the thin film is changed and a metal-insulator transition is induced across the thin film. In some embodiments, the electric field may be applied to the nanodot 430 through a conductive tip 405 of an AFM (atomic force microscope).

In some embodiments, the oxide thin film 420 is a $VO_2$ thin film and has a thickness of about 100 nm-200 nm. In some embodiments, a $VO_2$ thin film having a thickness of about 100 nm is synthesized by reactively dc sputtered in Ar (91.2%)+ $O_2$(8.8%) environment at about 10 mTorr from a V (vanadium) target. In these embodiments, the base pressure in the sputtering chamber is kept at about $2\times10^{-8}$ Torr. The substrate

410 is kept at about 550° C. during the deposition. Thin VO$_2$ films synthesized by this sputtering technique are described for example in the Ko & Ramanathan reference.

In some embodiments, the substrate 410 is an n-type doped silicon having a resistivity of about 0.002 Ωcm to about 0.005 Ωcm.

In some embodiments, the nanodot 430 includes a layer of Au (gold) on top of a layer of Cr (chromium). In one exemplary embodiment, the layer of Cr has a thickness of about 25 nm, and the layer of Au has a thickness of about 50 nm. In other embodiments, different sizes of the layers of Cr and Au may be fabricated and used.

The oxide nanostructure 400 may further include a controller (not shown) that is configured to controllably vary the electric field applied to the surface of the nanodots (for example through a conducting AFM tip) so as to control the conductance of the thin film until the metal-insulator transition is induced across the thin film.

The observation of electrically induced MIT in nanoscale VO$_2$ device junctions that use Au nanodot contacts fabricated by electron-beam lithography, as illustrated in FIG. 4, is described in a publication "Electrical Triggering of Metal-insulator Transition in Nanoscale Vanadium Oxide Junctions," by Dmitri Ruzmetov, Gokul Gopalakrishnan, Jiang-dong Deng, Venkatesh Narayanamurti, and Shriram Ramanathan, Journal of Applied Physics 106, 083702 (2009), the contents of which are incorporated by reference in its entirety for all that it teaches without exclusion of any part thereof.

In some embodiments, electron beam lithography is used to fabricate Au (55 nm, top layer)/Cr (25 nm, bottom layer) nanodots on the surface of the VO$_2$ thin film, as further described in conjunction with FIG. 5 below. The nanodots 430 may have a diameter of about 200 nm.

In some embodiments, the gold nanodots 430 serve as the top electrode in electrical measurements using a conducting tip AFM. One example of an AFM that may be used includes Asylum MFP-3D, although other embodiments may use different models and/or types of AFM. The n-Si conducting substrate under VO$_2$ film can serve as the bottom electrode when the electric field is applied. In embodiments in which an AFM is used to apply the electric field, topographic AFM images may be obtained, prior to using the AFM, and the point of contact may be selected on the topographic image. Then the AFM tip may be brought into contact with the Au dot surface.

Figure 5:
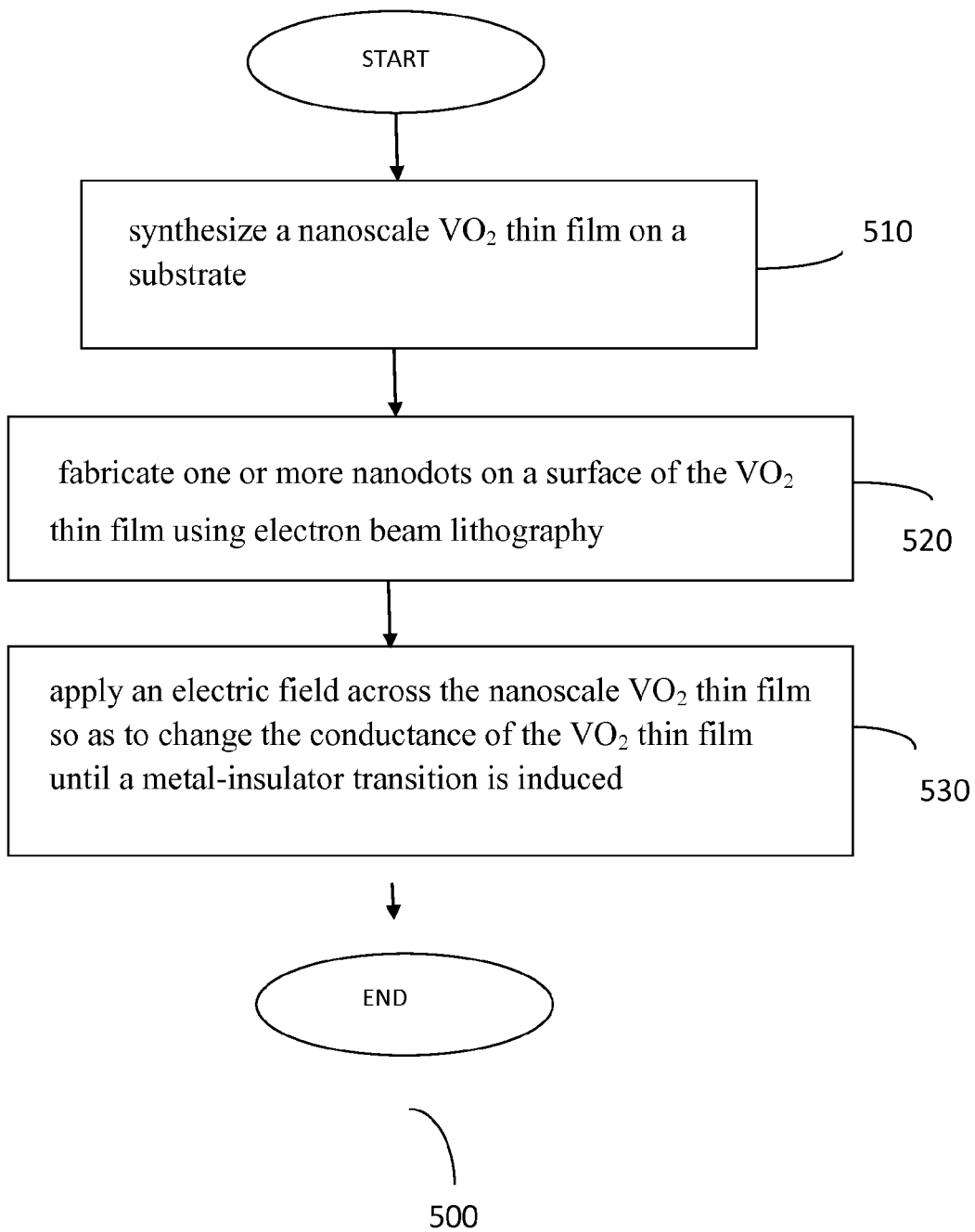
FIG. 5 illustrates a schematic flow chart of a method of electrically inducing a metal-insulator transition in a nanoscale oxide structure.

FIG. 5 illustrates a schematic flow chart of a method 500 of electrically inducing a metal-insulator transition in a nanoscale VO$_2$ device junction. The method 500 includes an act 510 of synthesizing a nanoscale VO$_2$ thin film on a substrate, and an act 520 of fabricating one or more nanodots on a surface of the VO$_2$ thin film using electron beam lithography. The method further includes an act 530 of applying an electric field across the nanoscale VO$_2$ thin film, thereby changing the conductance of the VO$_2$ thin film until the metal-insulator transition is induced.

As described above, the nanoscale VO$_2$ thin film may be synthesized by reactive DC sputtering from a V target in an environment including Ar and O$_2$, in a sputtering chamber having a base pressure of about $2 \times 10^{-8}$ Torr, while maintaining the substrate at about 550° Celsius.

A number of lithography techniques are commonly used for microfabrication of semiconductors and other devices, such as integrated circuits and micro-electromechanical systems. Lithographic processes typically involve selectively removing parts of a thin film, or the bulk of a substrate. In the case of ultra-small device sizes, for example below about few hundred nanometers, electron-beam lithography may be used. In electron beam lithography, a beam of electrons is scanned in a patterned fashion across a surface covered with a film of resist. The exposed or non-exposed regions of the resist are then selectively removed. Lithography is described in many textbooks and publications, one example of which is "*Lithography, Introduction to Microelectronic Fabrication,*" (by Jaeger, Richard C., 2002), which is incorporated herein by reference in its entirety for all that it teaches without exclusion of any part thereof.

In some embodiments of the present disclosure, electron beam lithography is used to fabricate nanodots that include Au and Cr layers, on the surface of the VO$_2$ thin film. The nanodots may have a diameter of about 200 nm. In these embodiments, a thin (about 20 nm) Cr layer is deposited on top of the e-beam sensitive resist, to prevent the deflection of the e-beam due to the charging of the sample surface during e-beam writing. The exposure of the resist underneath the metal layer can be achieved by operating at an unusually high beam voltage, for example about 100 kV, by using a state-of-the-art e-beam writer such as Elionix ELS-7000.

In these embodiments, the Cr layer is etched away before the resist was developed. After the developing of the resist, the surfaces can be cleaned by Ar plasma. The remaining lithography processes include metallization and lift-off.

In some embodiments of the present disclosure, the applied electric field may be varied to dynamically tune the optical and/or dielectric properties of a functional oxide thin film. In this way, novel oxide materials that have dynamically tunable optical properties may be created. This allows the design of metamaterials, as well as dielectric-metal nanostructures for optics, electro-optics and optoelectronics. The properties can be actively tuned by application of a voltage and hence can be done on ultra-fast time scales.

The functional oxide material may include, without limitation: pure VO$_2$; doped VO$_2$; and any other oxide that displays a metal-insulator transition. The functional oxide material may be a layered structures with VO$_2$ (or other oxides) coupled to oxides that can be used to inject charge.

In some embodiments, metal-oxide-semiconductor (MOS) devices may be fabricated that incorporate one or more of the above-described functional oxide material, whose properties can be controlled by means of external stimuli such as an electrical field, or temperature T.

Figure 6A:
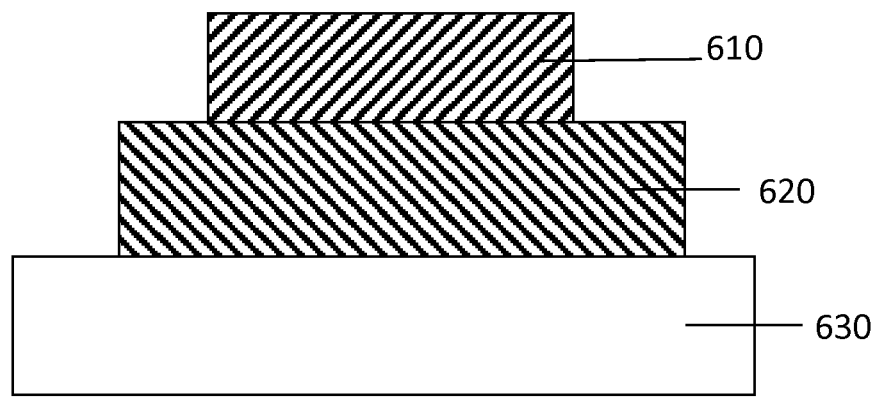
FIGS. 6A and 6B are schematic diagrams illustrating a system for dynamically tuning the properties of an oxide material.
Figure 6A:
Figure 6B:
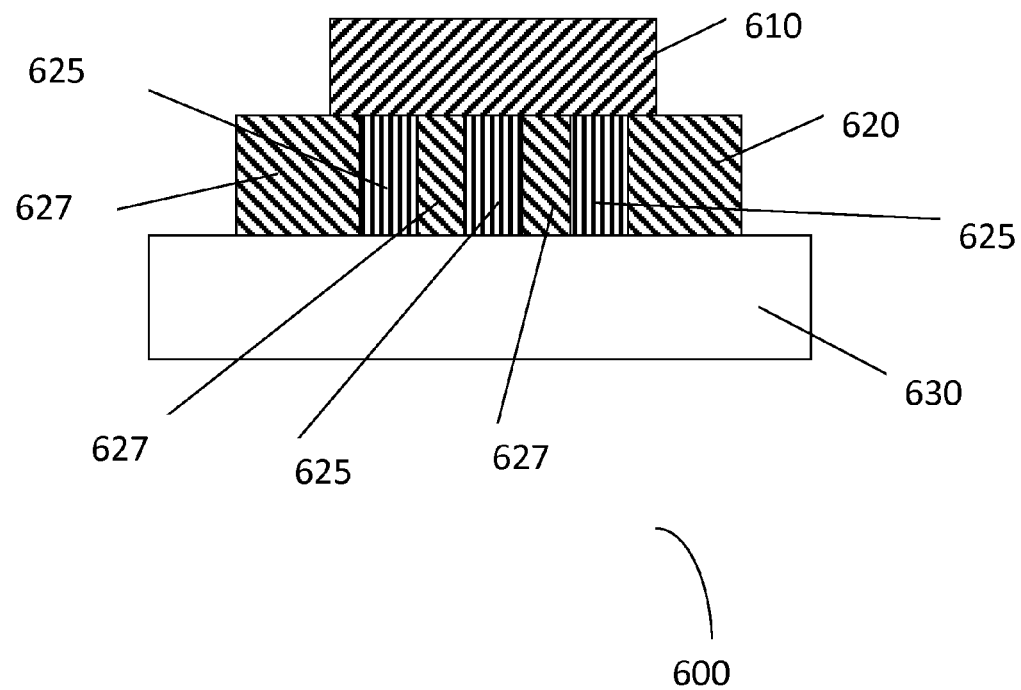

FIGS. 6A and 6B illustrate a schematic diagram of a system 600 for dynamically tuning the optical properties of an oxide material. The system 600 shown in FIG. 6A includes a thin film 620 of an oxide (such as a vanadium oxide) on a semiconductor substrate 630. On top of the oxide thin film 620 is a gate electrode 610 that can be deposited using a mask. Alternatively, a local probe, such as a conducting atomic force microscope tip, may be used.

The oxide layer 620 in the system 600 has a single phase structure, i.e. includes only a single conducting region, or a single insulating region, but not both.

FIG. 6B illustrates the transformation that the oxide layer 620 undergoes, when an electric field (i.e. electric voltage) is applied to the oxide layer 620. As shown in FIG. 6B, the oxide layer 620 undergoes a transition to a multi phase oxide layer, in response to an applied electric field. The multi phase oxide layer is a layer of a multi phase oxide material, i.e. the multi phase oxide layer includes one or more conducting regions 625 and one or more insulating regions 627.

Application of a voltage to the single-phase structure shown in FIG. 6A thus spontaneously leads to the formation of insulating regions or domains 627 and conducting regions or domains 625, within the active oxide material. This is because of the percolating nature of the metal-insulator transition. The single phase material thus spontaneously becomes multi-phase, by the application of small voltage pulses.

The multi-phase material may revert back to a single phase material by removing the voltage. Alternatively, the multi-phase material may revert back to a single phase material by applying a larger voltage.

The extent of these regions 625 and 627, i.e. the sizes and/or distributions of these regions 625 and 627, can be dynamically tuned by controllably varying a voltage or electric field, in some embodiments. The sizes and distributions of these regions may also be dynamically tuned by controllably varying the temperature, or by controllably varying the electric field in conjunction with the temperature. Alternatively, the sizes and distributions of these regions may be dynamically tuned by varying the pulse shapes of the applied voltage. The above-described variations may be performed over time periods that range from picoseconds to nanosecond timescales.

One or more properties of the oxide layer 620 may be dynamically tuned by varying the applied electric field, in some embodiments of the present disclosure. These properties include without limitation optical properties such as reflectance, transmittance, and dispersion, and dielectric properties such as conductance and permittivity.

In some embodiments, the dielectric properties of such materials can be tuned extraordinarily due to interfacial polarization at these heterogeneous interfaces.

Examples and descriptions of the tuning of dielectric properties (such as capacitance and conductance) by applying an electric field to active oxide materials, are contained in Ko and Ramanathan, "Dispersive capacitance and conductance across the phase transition boundary in metal-vanadium oxide-silicon devices," Journal of Applied Physics, 106, 034101, 2009 (the "JAP reference"). The JAP reference is incorporated herein by reference in its entirety for all that it teaches without exclusion of any part thereof.

Figure 7:
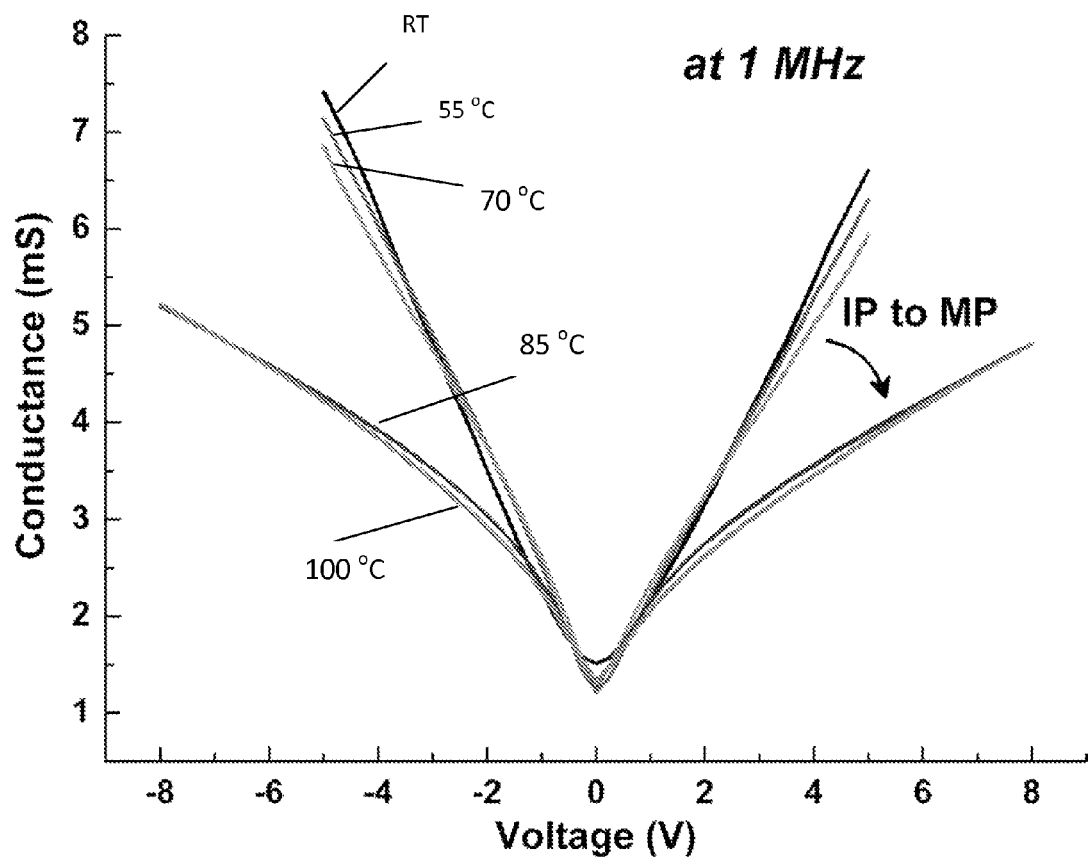
FIG. 7 illustrates dispersive conductance across the phase transition boundary in a metal-vanadium oxide-silicon device.
Figure 8:
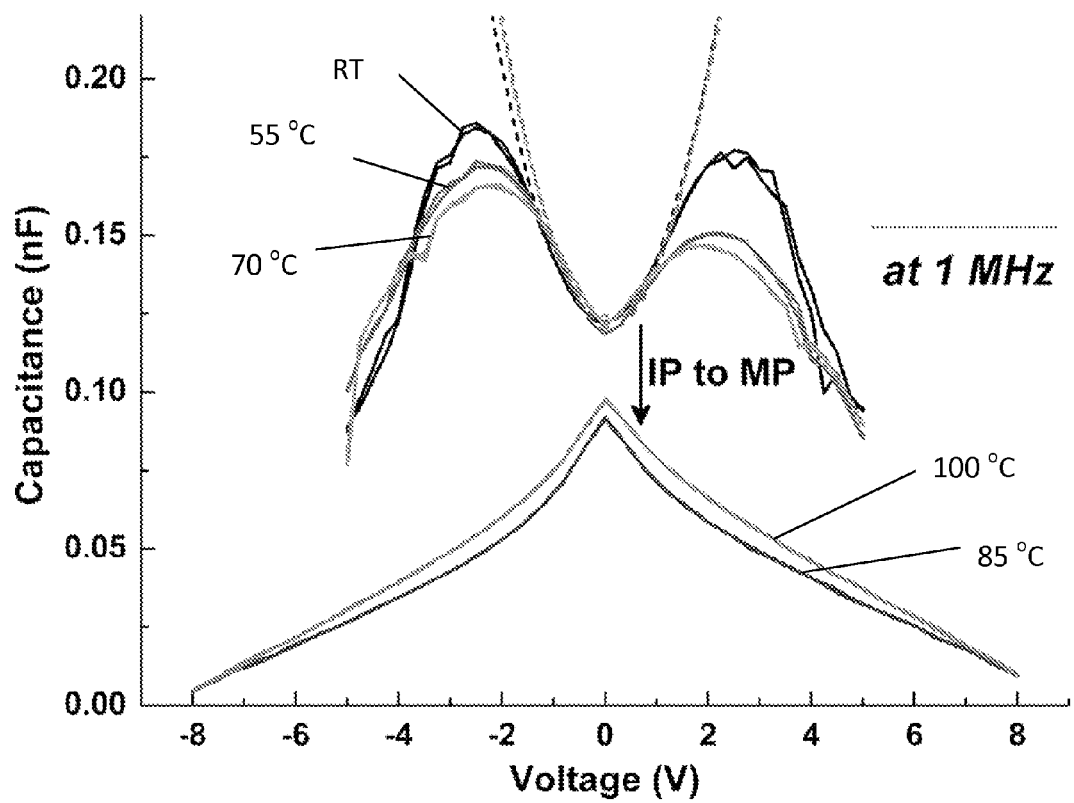
FIG. 8 illustrates dispersive capacitance across the phase transition boundary in a metal-vanadium oxide-silicon device.

In some embodiments, the dielectric and ac conductance responses of vanadium oxide thin films that undergo metal-insulator transition (MIT) may be tuned dynamically. In these embodiments, a $VO_2$ functional layer can act as a frequency and temperature tunable smart ma-terial, as described in the JAP reference. FIGS. 7 and 8 illustrate capacitance and ac conduc-tance characteristics of $VO_2$ thin films embedded in Pd—$VO_2$—Si capacitor devices as a function of temperature and electric field. $VO_2$-based devices may show large tunabilities, as high as ~95% and ~42%-54% respectively, in both metallic and insulating regimes.

FIG. 7 shows a set of AC (alternating current) conductance—voltage curves (G-V curves) measured in a metal-vanadium oxide-silicon device at 1 MHz, at various temperatures between RT and 100° C. As shown in FIG. 7, a clear transition in G-V behavior occurs across thermal MIT boundary, indicating different conduction mechanisms in the insulating and metal phases.

FIG. 8 shows a set of capacitance-voltage (C-V) curves measured in a metal-vanadium oxide-silicon device, under identical conditions as the conductance measurements illustrated in FIG. 7. Similar to the G-V characteristics illustrated in FIG. 7, a clear change in the C-V behavior across phase transition boundary can be observed, accompanied by a decrease in capacitance with increasing T.

Other features of the capacitance and ac conductance characteristics of $VO_2$ thin films embedded on Pd—$VO_2$—Si capacitor devices, including but not limited to frequency dependence and temperature dependence, are described in the JAP reference, the contents of which have been incorporated by reference in its entirety for all that it teaches without exclusion of any part thereof.

Fast switching and the possibility to control the resistance state of $VO_2$ electrically are desirable for the utilization of $VO_2$ in high speed electronics. Frequency tunable dielectrics are of interest due to its potential in telecommunication systems.

Using the methods and systems described above, artificial materials may be created whose properties can be dynamically tuned at nanoscale. Potential applications of the above-described tunable materials are wide-ranging and far-reaching, including without limitation the fields of metamaterials, negative refraction, cloaking, and other optoelectronic or electro-optic applications.

The components, steps, features, objects, benefits and advantages that have been discussed are merely illustrative. None of them, nor the discussions relating to them, are intended to limit the scope of protection in any way. Numerous other embodiments are also contemplated, including embodiments that have fewer, additional, and/or different components, steps, features, objects, benefits and advantages. The components and steps may also be arranged and ordered differently.

Nothing that has been stated or illustrated is intended to cause a dedication of any component, step, feature, object, benefit, advantage, or equivalent to the public. While the specification describes particular embodiments of the present disclosure, those of ordinary skill can devise variations of the present disclosure without departing from the inventive concepts disclosed in the disclosure.

While certain embodiments have been described of systems and methods relating to electric field induced phase transitions in oxide structures and dynamic tuning of the properties of the oxide structures, it is to be understood that the concepts implicit in these embodiments may be used in other embodiments as well. In the present disclosure, reference to an element in the singular is not intended to mean "one and only one" unless specifically so stated, but rather "one or more." All structural and functional equivalents to the elements of the various embodiments described throughout this disclosure, known or later come to be known to those of ordinary skill in the art, are expressly incorporated herein by reference.

What is claimed is:

1. A phase transition switch comprising:
   a substrate;
   a vanadium oxide thin film deposited on the substrate, the vanadium oxide thin film having a conductance that can be tuned by an electric field;
   an electrode fabricated on the vanadium oxide thin film; and
   a controller configured to controllably apply an electric field to the vanadium oxide thin film through the electrode, and to vary the applied electric field so as to tune the conductance of the thin film until a metal-insulator transition is induced across the thin film.

2. The phase transition switch of claim 1, wherein the substrate is a semiconductor substrate, and comprises at least one of: Si; Ge; and InAs.

3. The switch of claim 1, wherein the electrode comprises at least one of: a metal; a metal alloy; and a highly doped semiconductor.

4. The switch of claim 1, wherein the electrode is a layer of Pd, and has a thickness of about 200 nm.

5. A phase transition switch comprising:
   a substrate;

a vanadium oxide thin film deposited on the substrate;
an electrode fabricated on the vanadium oxide thin film; and
a controller configured to controllably apply an electric field to the vanadium oxide thin film through the electrode, so as to control the conductance of the thin film until a metal-insulator transition is induced across the thin film;
wherein the substrate is an As-doped silicon substrate, and wherein the vanadium oxide thin film has a thickness between about 50 nm and about 200 nm.

6. A phase transition switch comprising:
a substrate;
a vanadium oxide thin film deposited on the substrate;
an electrode fabricated on the vanadium oxide thin film; and
a controller configured to controllably apply an electric field to the vanadium oxide thin film through the electrode, so as to control the conductance of the thin film until a metal-insulator transition is induced across the thin film;
wherein the controller is further configured to apply the electric field to the vanadium oxide thin film at a temperature T, and to control a threshold electric field strength for initiating the metal-insulator transition by varying the temperature T.

7. An oxide nanostructure, comprising:
a substrate;
a nanoscale oxide thin film deposited on the substrate, the nanoscale oxide thin film having a conductance that can be changed by an electric field transmitted across the film; and
one or more nanodots deposited on the nanoscale oxide thin film;
wherein the nanodots are adapted, when an electric field is applied thereto, to transmit the electric field across the nanoscale thin film so that the conductance of the thin film is changed and a metal-insulator transition is induced across the thin film.

8. The oxide nanostructure of claim 7, further comprising:
a controller configured to controllably vary an electric field applied to the surface of the nanodots through a conducting AFM tip so as to control the conductance of the thin film until the metal-insulator transition is induced across the thin film.

9. An oxide nanostructure, comprising:
a substrate;
a nanoscale oxide thin film deposited on the substrate; and
one or more nanodots deposited on the nanoscale oxide thin film;
wherein the nanodots are adapted, when an electric field is applied thereto, to transmit the electric field across the nanoscale thin film so that the conductance of the thin film is changed and a metal-insulator transition is induced across the thin film; and
wherein the oxide comprises $VO_2$ (vanadium dioxide), and has a thickness of about 200 nm;
and wherein the substrate is an n-type doped silicon having a resistivity of $0.002\Omega cm$ to about $0.005\Omega cm$.

10. A system comprising:
a substrate;
a single phase oxide layer deposited on top of the substrate, the single phase oxide layer having a conductance that can be tuned by an electric field, and including only one of a single conducting region and a single insulating region; and
an electrode deposited on top of the single phase oxide layer;
wherein the single phase oxide layer is configured to undergo a transition to a multi phase oxide layer in response to an electric field applied to the single phase oxide layer through the electrode; and
wherein the multi phase oxide layer includes a multi phase oxide material having one or more optical and dielectric properties that are tunable by controllably varying the applied electric field, and
wherein the multi phase oxide layer includes one or more conducting regions and one or more insulating regions.

11. The system of claim 10, wherein the conducting regions and insulating regions have sizes and distributions that are tunable by controllably varying the applied electric field.

12. The system of claim 11, further comprising a controller configured to controllably apply the electric field to the single phase oxide layer through the electrode, so as to cause the single phase oxide layer to undergo the transition to the multi phase oxide layer, the controller further configured to controllably vary the applied electric field so as to tune the sizes and distributions of the conducting regions and the insulating regions within the multi phase oxide layer, and so as to tune the optical and dielectric properties of the multi phase oxide material.

* * * * *